United States Patent
Lee et al.

(10) Patent No.: US 10,571,961 B2
(45) Date of Patent: Feb. 25, 2020

(54) BACKPLATE AND FOLDABLE DISPLAY DEVICE INCLUDING THE SAME

(71) Applicant: LG Display Co., Ltd., Seoul (KR)

(72) Inventors: Gyu-Ho Lee, Paju-si (KR); Jun-Sik Hwang, Paju-si (KR); Nam Ki, Paju-si (KR); Chang-Woo Chun, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/216,971

(22) Filed: Dec. 11, 2018

(65) Prior Publication Data

US 2019/0187752 A1 Jun. 20, 2019

(30) Foreign Application Priority Data

Dec. 14, 2017 (KR) .................. 10-2017-0171966

(51) Int. Cl.
*G06F 1/16* (2006.01)
*G02F 1/1333* (2006.01)
*H01L 51/00* (2006.01)
*H01L 27/32* (2006.01)

(52) U.S. Cl.
CPC ...... *G06F 1/1616* (2013.01); *G02F 1/133305* (2013.01); *G06F 1/1641* (2013.01); *G06F 1/1652* (2013.01); *G06F 1/1679* (2013.01); *H01L 27/3244* (2013.01); *H01L 51/0097* (2013.01)

(58) Field of Classification Search
CPC . G02F 1/133305; G06F 1/1652; G06F 1/1679
See application file for complete search history.

(56) References Cited

U.S. PATENT DOCUMENTS

| | | | | |
|---|---|---|---|---|
| 2004/0252360 A1* | 12/2004 | Webber | ............. | G02F 1/133305 359/296 |
| 2014/0268555 A1* | 9/2014 | Kurczewski | .......... | G06F 1/1681 361/679.55 |
| 2014/0285417 A1* | 9/2014 | Johan | .................... | G06F 3/0488 345/156 |
| 2014/0320396 A1* | 10/2014 | Modarres | .............. | G06F 3/0412 345/156 |
| 2015/0055308 A1* | 2/2015 | Lim | ....................... | G04G 21/08 361/749 |
| 2015/0220117 A1* | 8/2015 | Lee | ........................ | G06F 1/1641 361/749 |
| 2016/0306392 A1* | 10/2016 | Park | ...................... | G06F 1/1652 |
| 2018/0049336 A1* | 2/2018 | Manuel | ............... | E05B 65/0067 |
| 2018/0059822 A1* | 3/2018 | Seo | ........................ | G06F 3/0414 |
| 2018/0129245 A1* | 5/2018 | Lai | ..................... | G02F 1/133308 |
| 2019/0089820 A1* | 3/2019 | Lin | ....................... | G06F 1/1616 |

* cited by examiner

*Primary Examiner* — Adrian S Wilson
(74) *Attorney, Agent, or Firm* — Fenwick & West LLP

(57) ABSTRACT

A backplate of a display device has a first rigid region, a second rigid region spaced apart from the first rigid region, and a flexible region between the first rigid region and the second rigid region. The flexible region includes an electromagnet and encloses a magneto-rheological fluid that suspends magnetic particles. The rigidity of the flexible region changes responsive to changes in magnetic field generated by the electromagnet.

18 Claims, 6 Drawing Sheets

BACKPLATE AND FOLDABLE DISPLAY DEVICE INCLUDING THE SAME

CROSS-REFERENCE TO RELATED APPLICATION

The present application claims the benefit of Republic of Korea Patent Application No. 10-2017-0171966 filed on Dec. 14, 2017, which is hereby incorporated by reference in its entirety.

BACKGROUND

Technical Field

The present disclosure relates to a display device and more particularly to a backplate having a reversibly changeable modulus value in a folding region and a foldable display device including the cover window.

Discussion of the Related Art

As information technology and mobile communication technology have been developed, a display device being capable of displaying a visual image has also been developed. Flat panel display devices, such as a liquid crystal display (LCD) device and an organic light emitting display (OLED) device, are developed and used.

An OLED device includes an organic emitting diode which includes an anode, a cathode and an organic emitting layer therebetween. In the organic emitting diode, holes and electrodes respectively from the anode and the cathode are combined such that light is emitted from the organic emitting layer to display images.

Recently, a display device, which is fabricated by using a flexible substrate and is foldable, bendable or rollable, is in demand. This display device may be referred to as a foldable display device. The foldable display device may be folded to be portable and may be unfolded to display images. Namely, with the foldable display device, a large-sized image display can be provided, and portability of the display device is improved.

Figure 1:
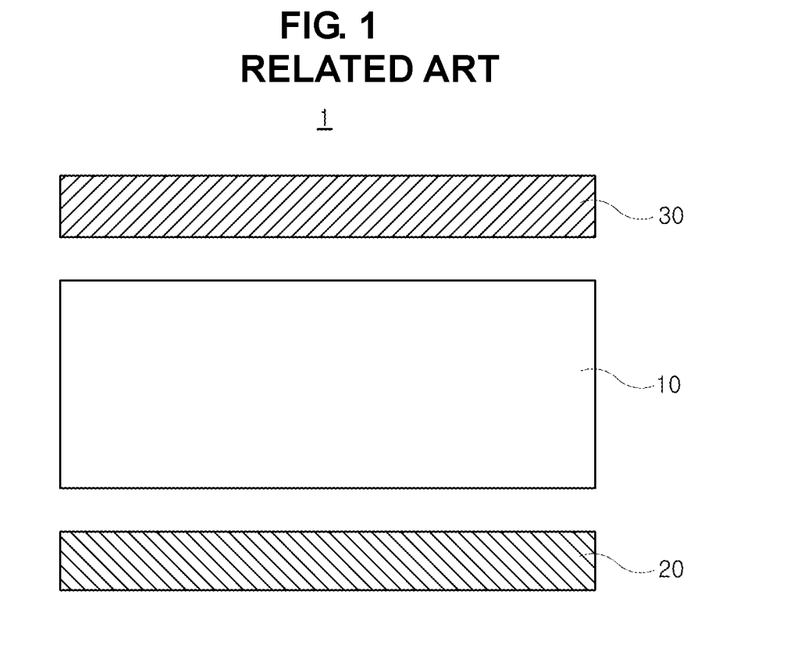
FIG. 1 is a schematic cross-sectional view of the related art foldable display device.

FIG. 1 is a schematic cross-sectional view of the related art foldable display device. As shown in FIG. 1, the foldable display device 1 includes a display panel 10, a backplate 20 and a cover window 30. When the display panel 10 is a light emitting diode panel, the display panel 10 may include a flexible substrate, a light emitting diode on the flexible substrate and a thin film transistor (TFT) for driving the light emitting diode. For example, the organic emitting diode may include an anode, which is connected to the TFT, an organic emitting layer on the anode, and a cathode on the organic emitting layer. In addition, an encapsulation film for preventing moisture penetration may cover the light emitting diode. With a carrier substrate (not shown) attached to a lower surface of the flexible substrate, elements such as the TFT are formed on the flexible substrate, and the carrier substrate is released to obtain the flexible display panel 10.

In the flexible display panel 10, since the flexible substrate is thin, the backplate 20 for supporting the display panel 10 is disposed under the display panel 10. The backplate 20 may be attached to the display panel 10 using an adhesive layer (not shown). The cover window 30 is attached to an upper side of the display panel 10. The damage on the display panel 10 from outer impacts is prevented by the cover window 30. Although not shown, the cover window 30 may be attached to the display panel 10 by an adhesive layer. For example, the cover window 30 may be formed of a tempered glass or high-hardness plastic.

Figure 2:
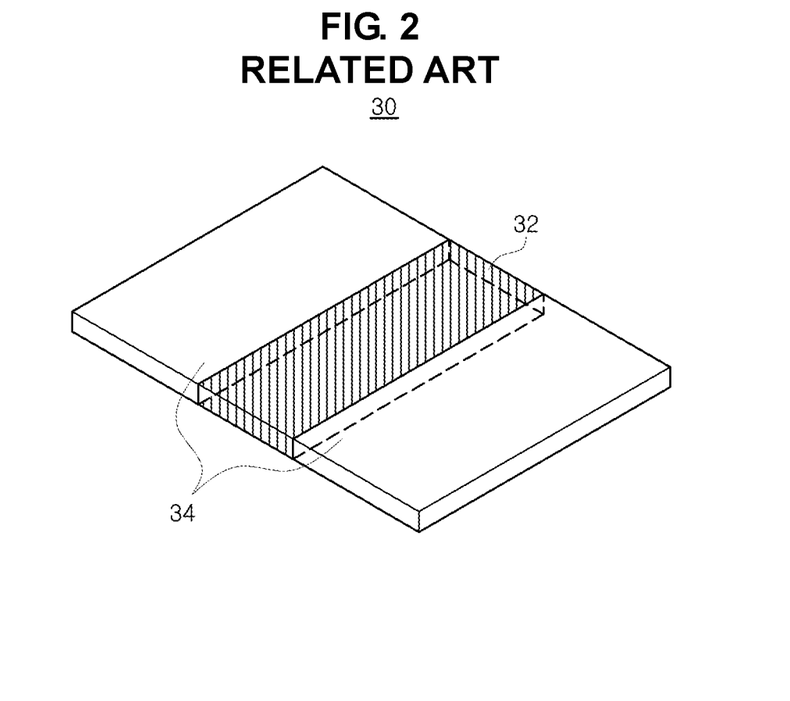
FIG. 2 is a schematic view of a backplate for the related art foldable display device.

FIG. 2 is a schematic view of a backplate for the related art foldable display device. As shown in FIG. 2, the backplate 30 includes a first region 32, which is formed of a low stiffness material, and a second region 34, which is formed of a high stiffness material, at both sides of the first region 32. The display device 1 (of FIG. 1) can be folded with respect to the first region 32. Namely, the first region 32, which is formed of the low stiffness material, of the backplate 30 corresponds to a folding region of the display device 1.

The damage on the backplate by the stress in the folding operation is relaxed or prevented by the first region 32, and the display panel 10 (of FIG. 1) is protected by the second region 34. However, when the related art foldable display device 1 is in the non-folding state, i.e., the flat state, the flatness of the display device is degraded by the first region 32 of the low stiffness material, i.e., the soft material. On the other hand, when the stiffness of the first region 32 is increased to improve the flatness of the display device 1 in the flat state, the folding property of the display device 1 is degraded. Namely, in the foldable display device 1, there is a trade-off relation between the folding property and the flatness.

SUMMARY

Embodiments relate to, a backplate including a first rigid region, a second rigid region spaced apart from the first rigid region, and a flexible region between the first rigid region and the second rigid region. The flexible region has at least one electromagnet and encloses a magneto-rheological fluid that suspends magnetic particles. The rigidity of the flexible region can be adjusted based on change in a magnetic field generated by the at least one electromagnet.

In another aspect, a backplate includes a first rigid region, a second rigid region spaced apart from the first rigid region, and a flexible region between the first rigid region and the second rigid region. The first rigid region, the second rigid region, and the flexible region enclose a magneto-rheological fluid that suspends magnetic particles. The backplate also includes a piston that is movable between a first state and a second state. In the first state, a head of the piston is placed within the second rigid region to render the flexible region foldable. In the second state, the head of the piston is placed within the flexible region to render the flexible region unfoldable. The backplate also includes an electromagnet in the first rigid region that moves the piston between the first state and the second state. In another aspect, a foldable display device includes a display panel and a backplate that is under the display panel, the backplate including a first rigid region, a second rigid region spaced apart from the first rigid region, and a flexible region between the first rigid region and the second rigid region. The flexible region has at least one electromagnet and encloses a magneto-rheological fluid that suspends magnetic particles. The rigidity of the flexible region can be adjusted based on change in a magnetic field generated by the at least one electromagnet.

In another aspect, a foldable display device includes a display panel and a backplate that is under the display panel, the backplate including includes a first rigid region, a second rigid region spaced apart from the first rigid region, and a flexible region between the first rigid region and the second rigid region. The first rigid region, the second rigid region, and the flexible region enclose a magneto-rheological fluid that suspends magnetic particles. The backplate also includes a piston that is movable between a first state and a second state. In the first state, a head of the piston is placed within the second rigid region to render the flexible region foldable. In the second state, the head of the piston is placed within the flexible region to render the flexible region unfoldable. The backplate also includes an electromagnet in the first rigid region that moves the piston between the first state and the second state.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles.

DETAILED DESCRIPTION

Reference will now be made in detail to the preferred embodiments, examples of which are illustrated in the accompanying drawings.

Figure 3:
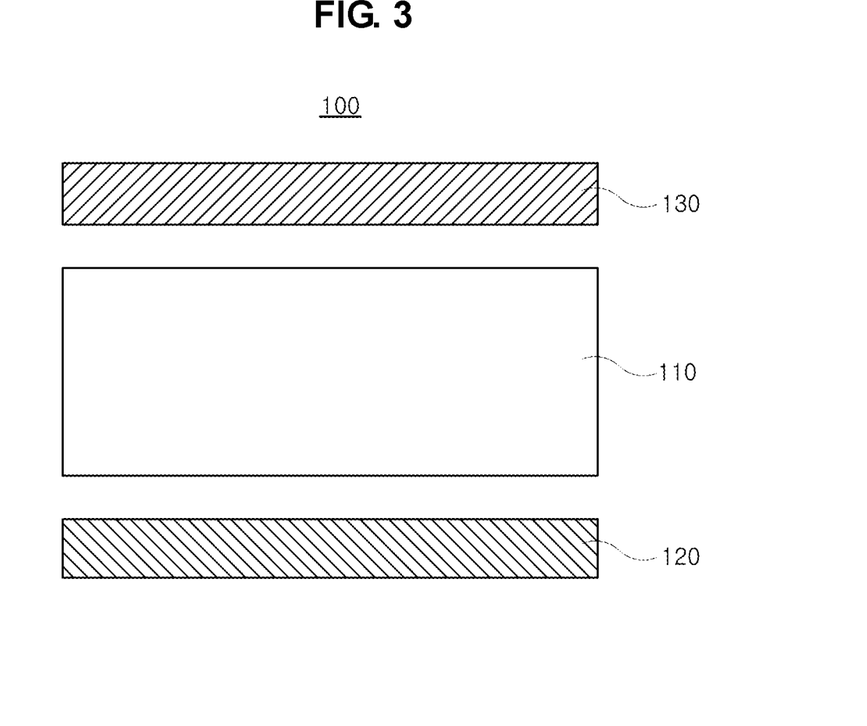
FIG. 3 is a schematic cross-sectional view illustrating a foldable display device according to the present disclosure.

FIG. 3 is a schematic cross-sectional view illustrating a foldable display device according to the present disclosure.

As shown in FIG. 3, a foldable display device 100 includes a display panel 110, a backplate 120 and a cover window 130.

The foldable display 100 device of the present disclosure can be folded, bent or rolled along at least one direction. The foldable display device of the present disclosure can be referred to as a bendable display device, a rollable display device or a flexible display device.

In the foldable display device 100, the backplate 120 is disposed under and covers a rear side of the display panel 110. The display panel 110 is protected and supported by the backplate 120. The cover window 130 is disposed on and covers a front side, i.e., a display side, of the display panel 110. The front side of the display panel 110 is protected by the cover window 130.

Although not shown, a touch panel may be positioned between the display panel 110 and the cover window 130.

Figure 4:
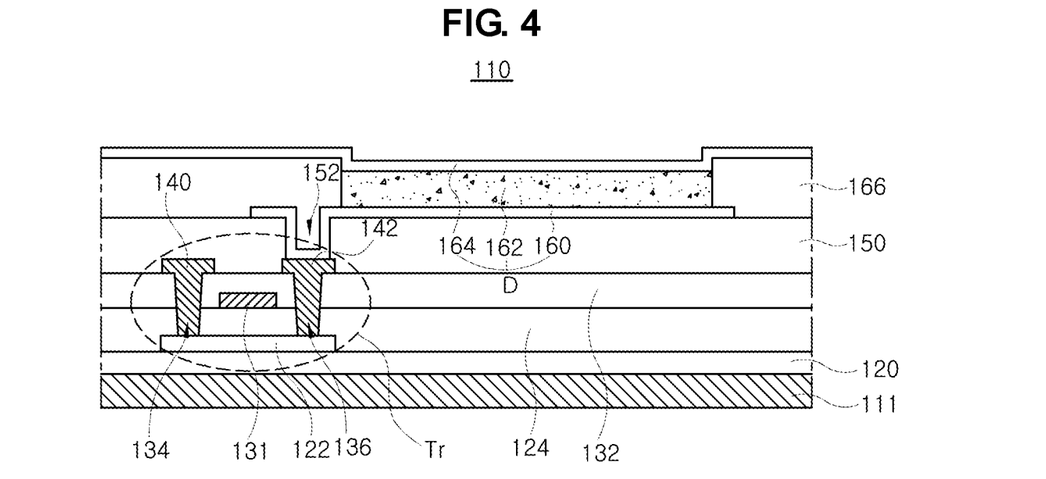
FIG. 4 is a schematic cross-sectional view illustrating a display panel of the foldable display device according to the present disclosure.

Referring to FIG. 4, which is a schematic cross-sectional view illustrating a display panel of the foldable display device according to the present disclosure, the display panel 110 includes a substrate 111, a thin film transistor (TFT) Tr on or over the substrate 111 and a light emitting diode D disposed over the substrate 111 and connected to the TFT Tr.

The substrate 111 may be a flexible plastic substrate. For example, the substrates 111 may be a polyimide substrate.

A buffer layer 120 is formed on the substrate 111, and the TFT Tr is formed on the buffer layer 120. The buffer layer 120 may be omitted.

A semiconductor layer 122 is formed on the buffer layer 120. The semiconductor layer 122 may include an oxide semiconductor material or polycrystalline silicon.

When the semiconductor layer 122 includes the oxide semiconductor material, a light-shielding pattern (not shown) may be formed under the semiconductor layer 122. The light to the semiconductor layer 122 is shielded or blocked by the light-shielding pattern such that thermal degradation of the semiconductor layer 122 can be reduced or prevented. On the other hand, when the semiconductor layer 122 includes polycrystalline silicon, impurities may be doped into both sides of the semiconductor layer 122.

A gate insulating layer 124 is formed on the semiconductor layer 122. The gate insulating layer 124 may be formed of an inorganic insulating material such as silicon oxide or silicon nitride.

A gate electrode 131, which is formed of a conductive material, e.g., metal, is formed on the gate insulating layer 124 to correspond to a center of the semiconductor layer 122.

In FIG. 4, the gate insulating layer 124 is formed on the entire surface of the substrate 111. Alternatively, the gate insulating layer 124 may be patterned to have the same shape as the gate electrode 131.

An interlayer insulating layer 132, which is formed of an insulating material, is formed on the gate electrode 131. The interlayer insulating layer 132 may be formed of an inorganic insulating material, e.g., silicon oxide or silicon nitride, or an organic insulating material, e.g., benzocyclobutene or photo-acryl.

The interlayer insulating layer 132 includes first and second contact holes 134 and 136 exposing both sides of the semiconductor layer 122. The first and second contact holes 134 and 136 are positioned at both sides of the gate electrode 131 to be spaced apart from the gate electrode 131.

In FIG. 4, the first and second contact holes 134 and 136 extend into the gate insulating layer 124. Alternatively, when the gate insulating layer 124 is patterned to have the same shape as the gate electrode 131, there may be no first and second contact holes 134 and 136 in the gate insulating layer 124.

A source electrode 140 and a drain electrode 142, which are formed of a conductive material, e.g., metal, are formed on the interlayer insulating layer 132. The source electrode 140 and the drain electrode 142 are spaced apart from each other with respect to the gate electrode 131 and respectively contact both sides of the semiconductor layer 122 through the first and second contact holes 134 and 136.

The semiconductor layer 122, the gate electrode 131, the source electrode 140 and the drain electrode 142 constitute the TFT Tr, and the TFT Tr serves as a driving element.

In FIG. 4, the gate electrode 131, the source electrode 140 and the drain electrode 142 are positioned over the semiconductor layer 122. Namely, the TFT Tr has a coplanar structure.

Alternatively, in the TFT Tr, the gate electrode may be positioned under the semiconductor layer, and the source and drain electrodes may be positioned over the semiconductor layer such that the TFT Tr may have an inverted staggered structure. In this instance, the semiconductor layer may include amorphous silicon.

Although not shown, a gate line and a data line are disposed on or over the substrate 111 and cross each other to define a pixel region. In addition, a switching element, which is electrically connected to the gate line and the data line, may be disposed on the substrate 111. The switching element is electrically connected to the TFT Tr as the driving element.

In addition, a power line, which is parallel to and spaced apart from the gate line or the data line, may be formed on or over the substrate 111. Moreover, a storage capacitor for maintaining a voltage of the gate electrode 131 of the TFT Tr during one frame, may be further formed on the substrate 111.

A passivation layer 150, which includes a drain contact hole 152 exposing the drain electrode 142 of the TFT Tr, is formed to cover the TFT Tr.

A first electrode 160, which is connected to the drain electrode 142 of the TFT Tr through the drain contact hole 152, is separately formed in each pixel region. The first electrode 160 may be an anode and may be formed of a conductive material having a relatively high work function. For example, the first electrode 160 may be formed of a transparent conductive material such as indium-tin-oxide (ITO) or indium-zinc-oxide (IZO).

When the display panel 110 is operated in a top-emission type, a reflection electrode or a reflection layer may be formed under the first electrode 160. For example, the reflection electrode or the reflection layer may be formed of silver (Ag) or aluminum-palladium-copper (APC) alloy. The first electrode 160 may have a triple-layered structure of ITO/Ag/ITO.

A bank layer 166, which covers edges of the first electrode 160, is formed on the passivation layer 150. A center of the first electrode 160 in the pixel region is exposed through an opening of the bank layer 166.

An emitting layer 162 is formed on the first electrode 160. The emitting layer 162 may have a single-layered structure of an emitting material layer formed of an emitting material. Alternatively, to improve emitting efficiency, the emitting layer 162 may have a multi-layered structure including a hole injection layer, a hole transporting layer, the emitting material layer, an electron transporting layer and an electron injection layer sequentially stacked on the first electrode 160.

The emitting material layer may include an inorganic emitting material, e.g., a quantum dot, or an organic emitting material, e.g., a phosphorescent compound or a fluorescent compound.

A second electrode 164 is formed over the substrate 111 including the emitting layer 162. The second electrode 164 is positioned at an entire surface of the display area. The second electrode 164 may be a cathode and may be formed of a conductive material having a relatively low work function. For example, the second electrode 164 may be formed of aluminum (Al), magnesium (Mg), Al—Mg alloy or Mg—Ag alloy.

The first electrode 160, the organic emitting layer 162 and the second electrode 164 constitute the light emitting diode D.

Although not shown, an encapsulation film is formed on the light emitting diode D to prevent penetration of moisture into the light emitting diode D. The encapsulation film may have has a triple-layered structure of a first inorganic layer, an organic layer and a second inorganic layer. However, it is not limited thereto. In addition, a polarization plate may be disposed on the encapsulation film to reduce an ambient light reflection. The polarization plate may be a circular polarization film.

Referring again to FIG. 3, the cover window 130 has a plate shape and covers a front side of the display panel 110. An adhesive layer may be formed between the cover window 130 and the display panel 110. In addition, a touch panel may be disposed between the cover window 130 and the display panel 110.

The backplate 120 may have a plate shape and cover the rear side of the display panel 110. Alternatively, the backplate 120 may include a horizontal surface and side surfaces to cover the rear side and lateral sides of the display panel 110.

Although not shown, an adhesive layer may be formed between the backplate 120 and the display panel 110.

A folding region is defined in both the cover window 130 and the backplate 120, and the foldable display device 100 can be folded or unfolded with respect to the folding region.

Figure 5:
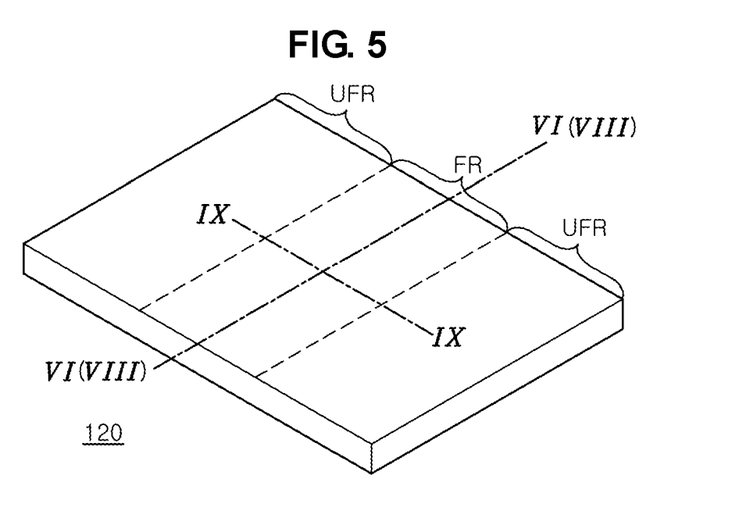
FIG. 5 is a schematic cross-sectional view illustrating a backplate of the foldable display device according to the present disclosure.

For example, referring to FIG. 5, which is a schematic cross-sectional view illustrating a backplate of the foldable display device according to the present disclosure, the backplate 120 includes a folding region FR and first and second unfolding regions UFR at both sides of the folding region FR. Namely, the folding region FR is disposed between the first and second unfolding regions UFR.

Figure 6:
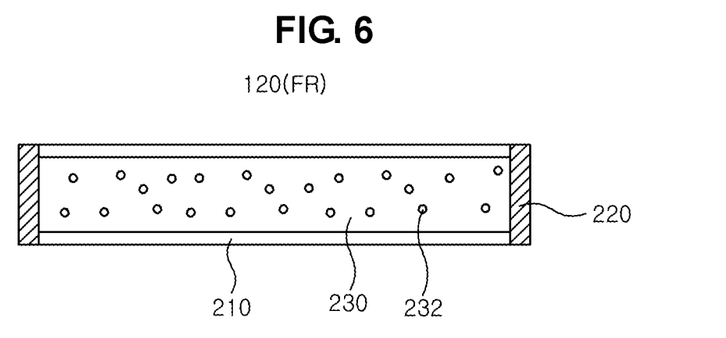
FIG. 6 is a schematic cross-sectional view of a portion of a backplate according to a first embodiment of the present disclosure.

FIG. 6 is a schematic cross-sectional view of a portion of a backplate according to a first embodiment of the present disclosure. FIG. 6 is a cross-sectional view taken along the line VI-VI and shows the folding region of the backplate.

As shown in FIG. 6, the folding region FR of the backplate 120 provides an inner space and includes a soft housing 210, which is connected or adjacent to the unfolding regions UFR (of FIG. 5) at both sides of the folding region FR, a magnetic field inducing part 220 at both ends of the folding region FR and a magneto-rheological fluid layer 230, which is positioned in the inner space and includes a magnetic particle 232. The inner space is closed by the soft housing 210 and the magnetic field inducing part 220. Namely, the magneto-rheological fluid layer 230 is positioned between the first and second unfolding regions UFR.

The soft housing 210 forms an upper surface and a lower surface of the backplate 120 in the folding region FR. For example, the soft housing 210 may include or be formed of fluorine rubber.

The magnetic field inducing part (e.g., an electro magnet) 220 is disposed at both ends of the folding region FR and connected (or combined) to the soft housing 210 to close the inner space of the soft housing 210. The magnetic field inducing part 220 may be a magnetic field inducing coil. The magnetic field inducing part 220 is configured to change a rigidity of the folding region FR based on change in magnetic field by generating a magnetic field. The magnetic field generated by the magnetic field inducing part 220 causes the magnetic particles 232 suspended in the magneto-rheological fluid layer 230 to be rearranged within the folding region FR, causing the rigidity to change.

In FIG. 6, the soft housing 210 does not cover side surfaces of the folding region FR, and the side surfaces are covered by the magnetic field inducing part 220. Alternatively, the soft housing 210 may further include side surfaces to close the inner space, and the magnetic field inducing part 220 may contact the side surfaces at two ends of the soft housing 210.

The magneto-rheological fluid layer 230 is disposed in the soft housing 210 and may have a plane area corresponding to the folding region FR of the backplate 120. The magneto-rheological fluid layer 230 includes the magnetic particle 232 dispersed in a fluid.

For example, the magnetic particle 232 may be a Fe particle, a Ni particle, a Co particle, a Fe—Co alloy particle, a Fe—Al alloy particle, a Fe—Si alloy particle, a Fe—Ni alloy particle, a Fe—V alloy particle, Fe—Mo alloy particle, Fe—Cr alloy particle, Fe—W alloy particle, a Fe—Mn alloy particle, a Fe—Cu alloy particle, a carbonyl iron particle, a Cr oxide particle, a stainless steel particle, a silicon steel particle, a Mn—Zn ferrite particle, a Cr oxide particle, a Fe nitride particle, a Fe oxide particle, an iron carbide particle, a ferrite-polymer particle, a Ni—Zn ferrite particle, a ferrite ($Fe_3O_4$) particle and their combination. It is preferred that the magnetic particle 232 may be a metal particle having high saturation magnetization, e.g., Fe, Ni, Co or carbonyl iron.

The magnetic particle 232 may have a sphere shape and a size (e.g. diameter) of several to several tens micrometers.

The fluid in the magneto-rheological fluid layer 230 may be water, ethanol, silicon oil, mineral oil, castor oil, hydraulic oil, lubricant oil, saturated hydrocarbon oil, unsaturated hydrocarbon oil, synthetic hydrocarbon oil, cyclo-paraffin oil, ethylene glycol, ethylene glycol ether, propylene glycol, octanol, machine oil, poly-alpha olefin (PAO), transformer oil, transformer insulating solution, halocarbon oil, paraffin oil, olive oil, corn oil, soybean oil or there combination.

In addition, for dispersion stability, thixotropy, wear resistance, chemical stability and anti-oxidation of the magnetic particle 232, the magneto-rheological fluid layer 230 may further include an additive. The additive may include at least one of inorganic clay, dispersants, surfactant, corrosion inhibitor, antifriction, wear resistant agent, antioxidant, thixotropic agent and suspension agent.

For example, the inorganic clay may be bentonite, hectorite, montmorillonite or inorganic pseudo-clay, which has a lamella structure and polar surface. The dispersant may be one of oleic acid, fat-acid metallic soap, polyalcohol, ammonium salt, fat-acid, polyethylene oxide, phosphate, phosphonate and their mixture.

The surfactant may be sulfonate, phosphate ester, stearic acid, glycerol monooleate, sorbitan sesquioleate, laurates, fat-acid, fatty alcohol, fluoroaliphatic polymeric ester, titanate, aluminate or zirconate.

The corrosion inhibitor may be sodium nitrite, sodium nitrate, sodium benzoate, borax, ethanolamine phosphate and their mixture. The wear resistant agent may be molybdenum disulfide, zinc phosphate, triaryl phosphate, triphenyl phosphorothionate, amine phosphate and their combination.

The magnetic particle 232 may be uniformly or randomly dispersed in the magneto-rheological fluid layer 230, and the magneto-rheological fluid layer 230 may have entirely uniform modulus value.

In this instance, the modulus value of the magneto-rheological fluid layer 330 is relatively low such that the folding region FR has a soft property. Namely, in the backplate 120, the modulus vale of the folding region FR is smaller than that of the unfolding region UFR. Accordingly, the foldable display device 100 (of FIG. 3) including the backplate 120 can be folded with respect to the folding region FR.

Figure 7:
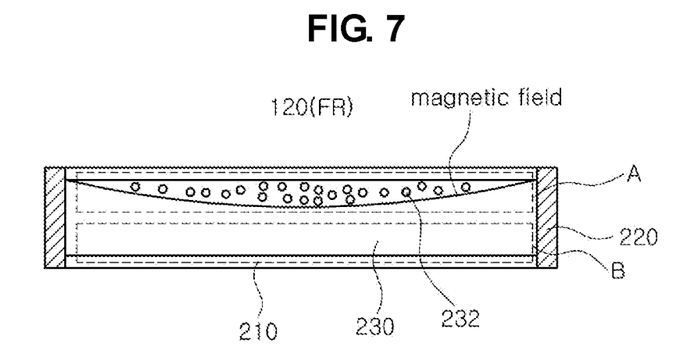
FIG. 7 is a schematic view illustrating an unfolding operation of the backplate according to the first embodiment of the present disclosure.

Referring to FIG. 7, which is a schematic view illustrating an unfolding operation of the backplate according to the first embodiment of the present disclosure, when a magnetic field is applied to the magneto-rheological fluid layer 230 by the magnetic field inducing part 220, the magnetic particle 232 is concentrated to be adjacent to an inner surface of the housing 210.

Namely, the magnetic particle 232 is concentrated in an upper region "A" of the magneto-rheological fluid layer 230 such that the upper region "A" of the magneto-rheological fluid layer 230 has a first modulus value. On the other hand, since there is no magnetic particle 232 in a lower region "B" of the magneto-rheological fluid layer 230 or a density of the magnetic particle in the lower region "B" of the magneto-rheological fluid layer 230 is decreased, the lower region "B" of the magneto-rheological fluid layer 230 has a second modulus value being smaller than the first modulus value. In other words, when the magnetic field is applied, the magneto-rheological fluid layer 230 has the first modulus value in a first surface side region and the second modulus value in a second surface side region. The display panel 110 is disposed to face the magneto-rheological fluid layer 230.

In other words, the modulus value, i.e., an elasticity, of the magneto-rheological fluid layer 230 is changeable or controllable by the magnetic field.

The modulus value of the folding region FR in the backplate 120 including the magneto-rheological fluid layer 230 is increased by the magnetic field such that the flatness of the backplate 120 is improved in the unfolding state.

The modulus value of the folding region FR according to the intensity of the magnetic field is measured and listed in Table 1.

TABLE 1

|  | Magnetic field [T] | | | | | | |
| --- | --- | --- | --- | --- | --- | --- | --- |
|  | 0 | 0.05 | 0.10 | 0.15 | 0.2 | 0.25 | 0.3 |
| Shear modulus [Pa] | 20 | 30 | 120 | $8.8 \times 10^2$ | $1.5 \times 10^4$ | $1.5 \times 10^5$ | $3.5 \times 10^5$ |

As shown in Table 1, the modulus value, i.e., the shear stress, of the folding region FR including the magneto-rheological fluid layer 230 is increased according to the intensity of the magnetic field. Namely, when the foldable display device 100 has the unfolding state, the backplate 120 has a relatively high modulus value in the folding region FR such that the flatness of the backplate 120 and the foldable display device 100 is improved.

As mentioned above, the backplate of the related art foldable display device has a constant modulus value in the folding region, the flatness of the backplate in the unfolding state is degraded.

However, in the foldable display device 100 of the present disclosure, the folding region FR of the backplate 120 has variable (changeable) modulus value. Accordingly, the folding region FR of the backplate 120 has a relatively low modulus value in the folding state such that the folding property of the foldable display device 100 including the backplate 120 is improved, while the folding region FR of the backplate 120 has a relatively high modulus value by the magnetic field in the unfolding state such that the flatness of the foldable display device 100 including the backplate 120 is improved.

Figure 8:
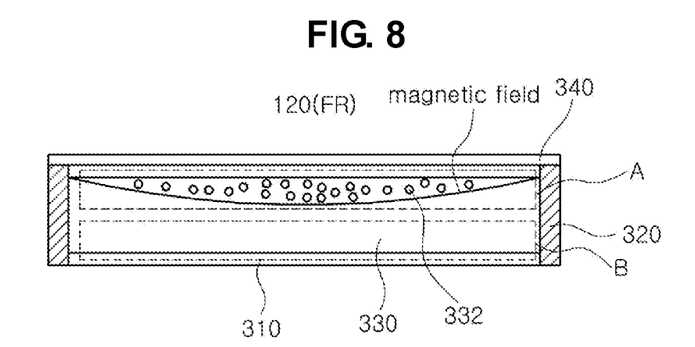
FIG. 8 is a schematic cross-sectional view of a portion of a backplate according to a second embodiment of the present disclosure.

FIG. 8 is a schematic cross-sectional view of a portion of a backplate according to a second embodiment of the present disclosure. FIG. 8 is a cross-sectional view taken along the line VIII-VIII and shows the folding region of the backplate.

As shown in FIG. 8, the folding region FR of the backplate 120 provides an inner space and includes a soft housing 310, which is connected or adjacent to the unfolding regions UFR (of FIG. 5) at both sides of the folding region FR, a magnetic field inducing part (e.g., electro magnet) 320 at both ends of the folding region FR, a magneto-rheological fluid layer 330, which is positioned in the inner space and includes a magnetic particle 332, and a magnetic field transporting member 340 at a surface, e.g., an upper surface, of the soft housing 310. The inner space is closed by the soft housing 310 and the magnetic field inducing part 320.

The soft housing 310 forms an upper surface and a lower surface of the backplate 120 in the folding region FR. For example, the soft housing 310 may include or be formed of a fluorine rubber.

The magnetic field inducing part 320 is disposed at both ends of the folding region FR and connected (or combined) to the soft housing 310 to close the inner space of the soft housing 310. The magnetic field inducing part 320 may be a magnetic field inducing coil.

The magneto-rheological fluid layer 330 is disposed in the soft housing 310 and may have a plane area corresponding to the folding region FR of the backplate 120. The magneto-rheological fluid layer 330 includes the magnetic particle 232 dispersed in a fluid.

For example, the magnetic particle 332 may be a Fe particle, a Ni particle, a Co particle, a Fe—Co alloy particle, a Fe—Al alloy particle, a Fe—Si alloy particle, a Fe—Ni alloy particle, a Fe—V alloy particle, a Fe—Mo alloy particle, Fe—Cr alloy particle, Fe—W alloy particle, a Fe—Mn alloy particle, a Fe—Cu alloy particle, a carbonyl iron particle, a Cr oxide particle, a stainless steel particle, a silicon steel particle, a Mn—Zn ferrite particle, a Cr oxide particle, a Fe nitride particle, a Fe oxide particle, an iron carbide particle, a ferrite-polymer particle, a Ni—Zn ferrite particle, a ferrite ($Fe_3O_4$) particle and their combination. It is preferred that the magnetic particle 232 may be a metal particle having high saturation magnetization, e.g., Fe, Ni, Co or carbonyl iron.

The magnetic particle 332 may have a sphere shape and a size (e.g. diameter) of several to several tens micrometers.

The fluid in the magneto-rheological fluid layer 330 may be water, ethanol, silicon oil, mineral oil, castor oil, hydraulic oil, lubricant oil, saturated hydrocarbon oil, unsaturated hydrocarbon oil, synthetic hydrocarbon oil, cyclo-paraffin oil, ethylene glycol, ethylene glycol ether, propylene glycol, octanol, machine oil, poly-alpha olefin (PAO), transformer oil, transformer insulating solution, halocarbon oil, paraffin oil, olive oil, corn oil, soybean oil or there combination.

In addition, for dispersion stability, thixotropy, wear resistance, chemical stability and anti-oxidation of the magnetic particle 332, the magneto-rheological fluid layer 330 may further include an additive. The additive may include at least one of inorganic clay, dispersants, surfactant, corrosion inhibitor, antifriction, wear resistant agent, antioxidant, thixotropic agent and suspension agent.

An end of the magnetic field transporting member 340 is connected to the magnetic field inducing part 320, and the magnetic field transporting member 340 covers the soft housing 310. The magnetic field transporting member 340 provides a flat surface with the unfolding region UFR.

The magnetic field transporting member 340 may include a conductive material having ferromagnetism. For example, the magnetic field transporting member 340 may include Fe, Co, Ni or their alloy.

When the magnetic field is not applied, the magnetic particle 332 may be uniformly or randomly dispersed in the magneto-rheological fluid layer 330, and the magneto-rheological fluid layer 330 have a first modulus value.

In this instance, the modulus value of the magneto-rheological fluid layer 230 is relatively low such that the folding region FR has a soft property. Namely, in the backplate 120, the modulus vale of the folding region FR is smaller than that of the unfolding region UFR. Accordingly, the foldable display device 100 (of FIG. 3) including the backplate 120 can be folded with respect to the folding region FR.

On the other hand, when the magnetic field inducing part 320 is driven, the magnetic field is uniformly applied to a surface of the soft housing 310 by the magnetic field inducing part 320 and the magnetic field transporting member 340. Accordingly, the magnetic field is applied to the magneto-rheological fluid layer 330, and the magnetic particle 332 is concentrated to be adjacent to the magnetic field transporting member 340.

Namely, the magnetic particle 332 is concentrated in an upper region "A" of the magneto-rheological fluid layer 330 such that the upper region "A" of the magneto-rheological fluid layer 330 has a first modulus value. On the other hand, since there is no magnetic particle 332 in a lower region "B" of the magneto-rheological fluid layer 330 or a density of the magnetic particle in the lower region "B" of the magneto-rheological fluid layer 330 is decreased, the lower region "B" of the magneto-rheological fluid layer 330 has a second modulus value being smaller than the first modulus value.

In other words, the modulus value, i.e., an elasticity, of the magneto-rheological fluid layer 330 is changeable or controllable by the magnetic field.

The modulus value of the folding region FR in the backplate 120 including the magneto-rheological fluid layer 330 is increased by the magnetic field such that the flatness of the backplate 120 is improved in the unfolding state.

As mentioned above, in the foldable display device 100 of the present disclosure, the folding region FR of the backplate 120 has variable (changeable) modulus value. Accordingly, the folding region FR of the backplate 120 has a relatively low modulus value in the folding state such that the folding property of the foldable display device 100 including the backplate 120 is improved, while the folding region FR of the backplate 120 has a relatively high modulus value by the magnetic field in the unfolding state such that the flatness of the foldable display device 100 including the backplate 120 is improved.

In addition, since the magnetic field is uniformly applied to an entire surface of the soft housing 310 by the magnetic field transporting member 340, the concentration degree of the magnetic particle 323 is improved such that the modulus value of the folding region FR in the unfolding state is further increased. As a result, that the flatness of the foldable display device 100 including the backplate 120 is further improved.

Figure 9:
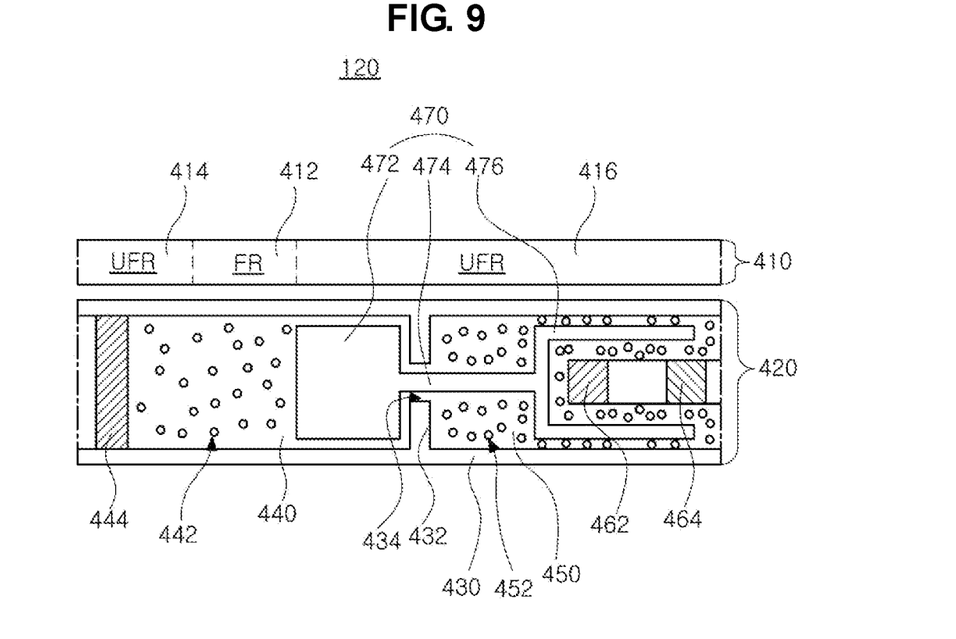
FIG. 9 is a schematic cross-sectional view of a portion of a backplate according to a third embodiment of the present disclosure.

FIG. 9 is a schematic cross-sectional view of a portion of a backplate according to a third embodiment of the present disclosure. FIG. 9 is a cross-sectional view taken along the line IX-IX and shows the backplate in the folding state.

As shown in FIG. 9, the backplate 120 includes an upper plate 410 including a soft region 412 and first and second hard regions 414 and 416 and a lower plate 420 including a housing 430, a magneto-rheological elastic layer 440, a magneto-rheological fluid layer 450, first to third magnetic field inducing parts 444, 462 and 464 and a piston 470. The upper plate 410 is positioned between the display panel 110 (of FIG. 3) and the lower plate 420. The soft region 412 includes a low stiffness material and corresponds to the folding region FR. The first and second hard regions 414 and 416 include a high stiffness material and are positioned at both sides of the soft region 412. Namely, the first and second hard regions 414 and 416 correspond to the unfolding region UFR.

For example, the soft region 412 may include silicon rubber or fluorine rubber, and each of the first and second hard regions 414 and 416 may include engineering plastic.

The housing 430 provides an inner space. The housing 430 may include or be formed of fluorine rubber. The housing 430 has a plane area corresponding to the soft region 412 and the first and second hard regions 414 and 416. The housing 430 includes a protruding part 432 for restricting a position of the piston 470 and providing a space for the magneto-rheological fluid layer 450. Namely, the protruding part 432 forms a hole 434 in correspondence to the second hard region 416, and a part of the piston 470 moves through the hole 434.

The magneto-rheological elastic layer 440 is disposed in the housing and corresponds to the soft region 412. The magneto-rheological elastic layer 440 includes a first magnetic particle 442 dispersed in a solid base. A volume of the magneto-rheological elastic layer 440 is variable or changeable by the magnetic field.

The solid base may be a natural rubber or a synthetic rubber. For example, the solid base may be formed of fluorocarbon rubber, urethane rubber, nitrile rubber, ethylene-propylene rubber, silicon rubber, styrene-butadiene rubber, modified styrene-butadiene rubber, butadiene rubber or modified butadiene rubber.

The magneto-rheological fluid layer 450 is disposed in the housing and corresponds to the second hard region 416. The magneto-rheological fluid layer 450 includes a second magnetic particle 452 dispersed in a fluid. In some embodiments, the fluid in the magneto-rheological fluid layer 450 is the same as the fluid in the magneto-rheological elastic layer 440. In other embodiments, the fluid in magneto-rheological fluid layer 450 is different from the fluid in the magneto-rheological elastic layer 440. A viscosity of the magneto-rheological fluid layer 450 is variable or changeable by the magnetic field. Namely, as explained with reference to FIG. 7, the magnetic particle 452 in the magneto-rheological fluid layer 450 is concentrated by the magnetic field such that the viscosity, i.e., the modulus value, of the magneto-rheological fluid layer 450 is increased.

The second magnetic particle 452 is dispersed in the fluid. For example, the fluid may be water, ethanol, silicon oil, mineral oil, castor oil, hydraulic oil, lubricant oil, saturated hydrocarbon oil, unsaturated hydrocarbon oil, synthetic hydrocarbon oil, cyclo-paraffin oil, ethylene glycol, ethylene glycol ether, propylene glycol, octanol, machine oil, poly-alpha olefin (PAO), transformer oil, transformer insulating solution, halocarbon oil, paraffin oil, olive oil, corn oil, soybean oil or there combination.

Each of the first and second magnetic particles 442 and 452 may be a Fe particle, a Ni particle, a Co particle, a Fe—Co alloy particle, a Fe—Al alloy particle, a Fe—Si alloy particle, a Fe—Ni alloy particle, a Fe—V alloy particle, Fe—Mo alloy particle, Fe—Cr alloy particle, Fe—W alloy particle, a Fe—Mn alloy particle, a Fe—Cu alloy particle, a carbonyl iron particle, a Cr oxide particle, a stainless steel particle, a silicon steel particle, a Mn—Zn ferrite particle, a Cr oxide particle, a Fe nitride particle, a Fe oxide particle, an iron carbide particle, a ferrite-polymer particle, a Ni—Zn ferrite particle, a ferrite ($Fe_3O_4$) particle and their combination.

Each of the first and second magnetic particles 442 and 452 may have a sphere shape and a size (e.g. diameter) of several to several tens micrometers.

The first magnetic field inducing part 444 is positioned in the first hard region 414 and is attached onto an end of the magneto-rheological elastic layer 440. The first magnetic field inducing part 444 generates the magnetic field for driving the magneto-rheological elastic layer 440.

The second and third magnetic field inducing parts 462 and 464 are positioned in the second hard region 416 and spaced apart from each other. The second and third magnetic field inducing parts 462 and 464 generates the magnetic field for driving the magneto-rheological fluid layer 450. The second magnetic field inducing part 462 is positioned between a piston head 472 and the third magnetic field inducing part 464.

Each of the first to third magnetic field inducing parts 444, 462 and 464 may be a magnetic field inducing coil.

The piston 470 includes the piston head 472, a shaft 474 connected to the piston head 472 and a bridge 476 branched from the shaft 474. The position of the piston 470 is controlled by the viscosity change of the magneto-rheological fluid layer 450.

A thickness of the piston head 472 may be substantially equal to that of the magneto-rheological elastic layer 440, and a length of the piston head 472 may be substantially equal to a width (or length) of the folding region FR, i.e., the soft region 412. As such, a volume of the piston head 472 is substantially equal to that of the folding region FR or the soft region 412. An end of the piston head 472 may be attached on the other end of the magneto-rheological elastic layer 440. Namely, the magneto-rheological elastic layer 440 is positioned between the first magnetic field inducing part 444 and the piston head 472, and both ends of the magneto-rheological elastic layer 440 respectively contact the first magnetic field inducing part 444 and the piston 470, i.e., the piston head 472.

The shaft 474 extends from the piston head 472 into the magneto-rheological fluid layer 450 through the hole 434 of the housing 430. The bridge 476 is connected to and extends from the shaft 474. The second and third magnetic field inducing parts 462 and 464 are surrounded by the bridge 476.

In the folding operation of the backplate 120, the first and second magnetic field inducing parts 444 and 462 are turned off, and the third magnetic field inducing part 464 is turned on. In this instance, since the magnetic field is not applied to the magneto-rheological elastic layer 440, the magneto-rheological elastic layer 440 has a first volume and corresponds to the soft region 412 of the upper plate 410.

On the other hand, since the magnetic field is applied to the magneto-rheological fluid layer 450 by the third magnetic field inducing part 464, the viscosity of the magneto-rheological fluid layer 450 is increased. Namely, the second magnetic particle 452 in the magneto-rheological fluid layer 450 is concentrated into a region, where the third magnetic field inducing part 464 is disposed, such that the viscosity of the magneto-rheological fluid layer 450 is partially increased. As a result, the position of the piston 470 is fixed in the second hard region 416.

In this instance, the magneto-rheological elastic layer 440 has a relatively low modulus value such that the folding property of the folding region FR of the backplate 120 is improved.

Figure 10:
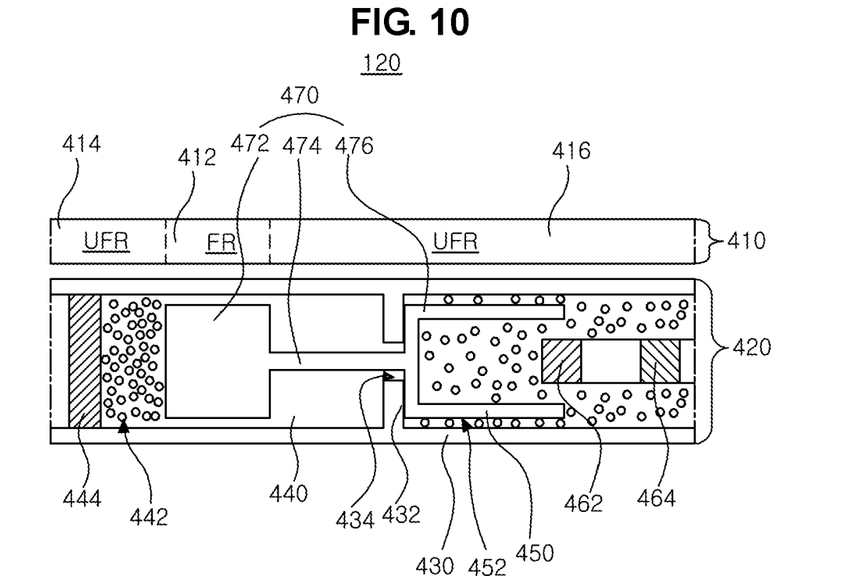
FIG. 10 is a schematic view illustrating an unfolding operation of the backplate according to the third embodiment of the present disclosure.

On the other hand, referring to FIG. 10, which is a schematic view illustrating an unfolding operation of the backplate according to the third embodiment of the present disclosure, when the first magnetic field inducing parts 444 is turned on and the second and third magnetic field inducing parts 462 and 464 are turned off, the first magnetic particle 442 in the magneto-rheological elastic layer 440 is rearranged such that the magneto-rheological elastic layer 440 has a second volume, which is smaller than the first volume. In addition, the viscosity of the magneto-rheological fluid layer 450 is decreased such that the piston head 472 moves toward the soft region 412. Accordingly, the magneto-rheological elastic layer 440 is disposed to correspond to the first hard region 414 of the upper plate 410, and the piston head 472 is disposed to correspond to the soft region 412.

Then, the second magnetic field inducing part 462 is turned on such that the viscosity of the magneto-rheological fluid layer 450 is increased and the position of the piston head 472 is fixed to corresponding to the soft region 412. Namely, the second magnetic particle 452 in the magneto-rheological fluid layer 450 is concentrated in a region, where the second magnetic field inducing part 462 is disposed, such that the viscosity of the magneto-rheological fluid layer 450 is partially increased.

In the unfolding state, in which the foldable display device 100 including the backplate 120 has a flat state, the piston head 472 is positioned to correspond to the folding region FR, the modulus value of the folding region FR is increased. As a result, the flatness of the backplate 120 and the foldable display device 100 is improved.

In addition, in the unfolding state, since the first magnetic particle 442 in the magneto-rheological elastic layer 440 is concentrated by the magnetic field induced by the first magnetic field inducing part 444, the modulus value of the magneto-rheological elastic layer 440, which is positioned to correspond to the first hard region 414, is increased. Accordingly, the stiffness of the unfolding region UFR is not decreased, and the flatness of the backplate 120 and the foldable display device 100 is further improved.

When the foldable display device 100 is switched from the unfolding state into the folding state, the first and second magnetic field inducing parts 444 and 462 are turned off to set back the magneto-rheological elastic layer 440 and the piston head 472. Then, the third magnetic field inducing part 464 is turned on such that the position of the magneto-rheological elastic layer 440 and the piston head 472 is fixed as shown in FIG. 9.

The bending force of the magneto-rheological elastic layer according to the intensity of the magnetic field and the weight % of the magnetic particle to the solid base is measured and listed in Table 2.

TABLE 2

| Magnetic field [T] | Magnetic particle (wt %) | | | | |
|---|---|---|---|---|---|
| | 0 | 20 | 50 | 60 | 80 |
| Bending force [gf]   0 T | 10 | 20 | 25 | 30 | 30 |
| 0.3 T | 10 | 40 | 350 | 450 | 550 |

As shown in Table 2, the bending force of the magneto-rheological elastic layer is increased according to the amount, i.e., the weight %, of the magnetic particle. On the other hand, with the magnetic field, the bending force of the magneto-rheological elastic layer is significantly increased according to the amount of the magnetic particle.

Accordingly, when the volume of the magneto-rheological elastic layer 440 is decreased and the magneto-rheological elastic layer 440 is disposed to correspond to the first hard region 414 by turning on the first magnetic field inducing part 444, the stiffness (or hardness) of the first hard region 414 is improved.

The length change of the magneto-rheological elastic layer according to the intensity of the magnetic field is measured and listed in Table 3. The initial length of the magneto-rheological elastic layer is 10 mm.

TABLE 3

| | Magnetic field [T] | | | | | |
|---|---|---|---|---|---|---|
| | 0 | 0.10 | 0.2 | 0.3 | 0.4 | 0.5 |
| Length decrease (mm) | 0 | <1.0 | 1.8 | 7.1 | 8.9 | 10 |

As shown in Table 3, the length of the magneto-rheological elastic layer is decreased according to the intensity of the magnetic field. In addition, the degree of the length decrease of the magneto-rheological elastic layer is increased according to the intensity of the magnetic field.

Namely, in the backplate 120, when the magnetic field is applied to the magneto-rheological elastic layer 440 by the first magnetic field inducing part 444, the volume of the magneto-rheological elastic layer 440 is decreased and the position of the magneto-rheological elastic layer 440 can be changed by the piston 470.

To show the viscosity change of the magneto-rheological fluid layer according to the intensity of the magnetic field, the pressure force of the piston to the magneto-rheological fluid layer is measured and listed in Table 4.

TABLE 4

| | Magnetic field [T] | | | | |
|---|---|---|---|---|---|
| | 0 | 0.1 | 0.3 | 0.5 | 0.7 |
| Pressure force [Kgf] | <0.05 | 0.5 | 1.0 | 1.9 | 2.1 |

As shown in Table 4, the pressure force of the piston is increased according to the intensity of the magnetic field. Namely, when the magnetic field is applied to the magneto-rheological fluid layer 450, the viscosity of the magneto-rheological fluid layer 450 is increased such that the position of the piston can be fixed.

In the backplate 120 of the third embodiment of the present disclosure, the modulus value of the folding region FR can be variable by the volume change of the magneto-rheological elastic layer 440 and the viscosity change of the magneto-rheological fluid layer 450 with the magnetic field.

Accordingly, the folding operation property in the folding state and the flatness in the unfolding state are improved.

It will be apparent to those skilled in the art that various modifications and variations can be made in the cover window and the foldable display device including the same of the present disclosure without departing from the technical idea or scope of the disclosure. Thus, it is intended that the present disclosure cover the modifications and variations of this disclosure provided they come within the scope of the appended claims and their equivalents.

What is claimed is:

1. A backplate, comprising:
   a first rigid region;
   a second rigid region spaced apart from the first rigid region;
   a flexible region between the first rigid region and the second rigid region, the flexible region comprising at least one electromagnet and enclosing a magneto-rheological fluid that suspends magnetic particles, a rigidity of the flexible region changing responsive to change in a magnetic field generated by the at least one electromagnet;
   a housing in the flexible region configured to contain the magneto-rheological fluid, a first side surface of the housing connected to the first rigid region, and a second side surface opposite from the first side surface of the housing connected to the second rigid region; and
   a magnetic field transporting member connected to an upper surface of the housing and connected perpendicular to the first side surface and the second side surface, the magnetic field transporting member in conjunction with the at least one electromagnet generating the magnetic field,
      wherein a first electromagnet of the at least one electromagnet is at the first side surface connected to the first rigid region, and a second electromagnet of the at least one electromagnet is at the second side surface connected to the second rigid region.

2. The backplate according to claim 1, wherein the magneto-rheological fluid has a first modulus value when no magnetic field is applied and has a second modulus value when applied with the magnetic field generated by the at least one electromagnet, the second modulus value greater than the first modulus value.

3. The backplate according to claim 1, wherein when no magnetic field is generated by the first electromagnet and the second electromagnet, the magneto-rheological fluid including the magnetic particles has a uniform first modulus value, and
   wherein when the magnetic field generated by the first electromagnet and the second electromagnet, the magnetic particles of a first density is suspended in an upper region of the magneto-rheological fluid and the magnetic particles of a second density lower than the first density is suspended in a lower region at a location lower than the upper region of the magneto-rheological fluid, such that the upper region has a second modulus value and the lower region has a third modulus value, the second modulus value greater than the first and third modulus values.

4. A backplate, comprising:
   a first rigid region;
   a second rigid region spaced apart from the first rigid region;
   a flexible region between the first rigid region and the second rigid region, wherein the first rigid region, the second rigid region, and the flexible region enclose a magneto-rheological fluid that suspends magnetic particles;
   a piston configured to move between a first state and a second state, wherein:
      in the first state, a head of the piston is placed within the second rigid region to render the flexible region foldable, and
      in the second state, the head of the piston is placed within the flexible region to render the flexible region unfoldable; and
   a first electromagnet in the first rigid region and configured to move the piston between the first state and the second state.

5. The backplate according to claim 4, wherein a first density of the magnetic particles are suspended in the magneto-rheological fluid in the first rigid region in the first state, and a second density of the magnetic particles are suspended in the magneto-rheological fluid in a second state, the first density higher than the second density.

6. The backplate according to claim 4, further comprising:
   a second electromagnet in the second rigid region; and
   a third electromagnet in the second rigid region spaced from the first electromagnet, wherein a distance between the second electromagnet and the head of the piston is less than a distance between the third electromagnet and the head of the piston.

7. The backplate according to claim 6, wherein, in the first state, the electromagnet in the first rigid region is turned off, the second electromagnet in the second rigid region is turned off, and the third electromagnet in the second rigid region is turned on.

8. The backplate according to claim 6, wherein, in the second state, the electromagnet in the first rigid region is turned on, the second electromagnet in the second rigid region is turned off, and the third electromagnet in the second rigid region is turned off.

9. The backplate according to claim 8, wherein when the piston moves from the first state to the second state, the magneto-rheological fluid in the flexible region is displaced to the second rigid region.

10. The backplate according to claim 4, wherein the piston includes the head, a bridge, and a shaft connecting the head of the piston to the bridge.

11. The backplate according to claim 10, wherein a volume of the piston head is substantially equal to a volume of the flexible region.

12. The backplate according to claim 10, wherein the bridge and the shaft remain in the magneto-rheological fluid in the second rigid region.

13. The backplate according to claim 4, further comprising a plate having (i) a first rigid portion overlaid on the first rigid region, (ii) a second rigid portion overlaid on the second rigid region, and (iii) a flexible portion overlaid on the flexible portion, the flexible portion of the portion made of a first material and the first and second rigid portions of the plate made of a second material that is stiffer than the first material.

14. The backplate according to claim 4, further comprising:
   a housing part of which forms the first rigid region, the second rigid region, and the flexible region, wherein the housing has a protruding part that internally protrudes in the second rigid region to restrict movement of the piston.

15. A foldable display device, comprising:

a display panel; and a backplate disposed under the display panel, the backplate comprising:

a first rigid region;

a second rigid region spaced apart from the first rigid region;

a flexible region between the first rigid region and the second rigid region, the flexible region comprising at least one electromagnet and enclosing a magneto-rheological fluid that suspends magnetic particles, a rigidity of the flexible region changing responsive to change in a magnetic field generated by the at least one electromagnet;

a housing in the flexible region configured to contain the magneto-rheological fluid, a first side surface of the housing connected to the first rigid region, and a second side surface opposite from the first side surface of the housing connected to the second rigid region; and a magnetic field transporting member connected to an upper surface of the housing and connected perpendicular to the first side surface and the second side surface, the magnetic field transporting member in conjunction with the at least one electromagnet generating the magnetic field, wherein a first electromagnet of the at least one electromagnet is at the first side surface connected to the first rigid region, and a second electromagnet of the at least one electromagnet is at the second side surface connected to the second rigid region.

16. The foldable display device according to claim 15, wherein the magneto-rheological fluid has a first modulus value when no magnetic field is applied and has a second modulus value when applied with the magnetic field generated by the at least one electromagnet, the second modulus value greater than the first modulus value.

17. A foldable display device, comprising:

a display panel; and a backplate disposed under the display panel, the backplate comprising:

a first rigid region;

a second rigid region spaced apart from the first rigid region;

a flexible region between the first rigid region and the second rigid region, wherein the first rigid region, the second rigid region, and the flexible region enclose a magneto-rheological fluid that suspends magnetic particles;

a piston configured to move between a first state and a second state, wherein:

in the first state, a head of the piston is placed within the second rigid region to render the flexible region foldable, and in the second state, the head of the piston is placed within the flexible region to render the flexible region unfoldable; and a first electromagnet in the first rigid region and configured to move the piston between the first state and the second state.

18. The foldable display device according to claim 17 further comprising:

a second electromagnet in the second rigid region; and a third electromagnet in the second rigid region spaced from the second electromagnet, wherein a distance between the second electromagnet is closer to the head of the piston than a distance between the third electromagnet to the head of the piston.

* * * * *